United States Patent
Nose

(10) Patent No.: US 10,830,648 B2
(45) Date of Patent: Nov. 10, 2020

(54) ABNORMAL TEMPERATURE DETECTION SYSTEM, ABNORMAL TEMPERATURE DETECTION CABLE AND CABLE

(71) Applicant: FANUC CORPORATION, Yamanashi (JP)

(72) Inventor: Shingo Nose, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/407,949

(22) Filed: May 9, 2019

(65) Prior Publication Data

US 2019/0353530 A1    Nov. 21, 2019

(30) Foreign Application Priority Data

May 16, 2018   (JP) .................................. 2018-094546

(51) Int. Cl.
*G01K 15/00*   (2006.01)
*G01K 1/00*    (2006.01)
(Continued)

(52) U.S. Cl.
CPC .............. *G01K 3/14* (2013.01); *G01K 13/00* (2013.01); *G01R 31/58* (2020.01); *H05K 1/118* (2013.01);
(Continued)

(58) Field of Classification Search
USPC ...................... 374/1, 152, 183, 208, 166, 141
See application file for complete search history.

(56) References Cited

U.S. PATENT DOCUMENTS 4,845,315 A * 7/1989 Stopper ................ H01B 7/0846
                                                        361/827
6,152,597 A * 11/2000 Potega ..................... G01K 1/02
                                                        374/185
(Continued)

FOREIGN PATENT DOCUMENTS

CN        2824170 Y    10/2006
CN      101216979 A     7/2008
(Continued)

OTHER PUBLICATIONS

Office Action mailed by the Japanese Patent Office dated Feb. 12, 2020, which corresponds to Japanese Patent Application No. 2018-094546 with English translation.
(Continued)

*Primary Examiner* — Mirellys Jagan
(74) *Attorney, Agent, or Firm* — Studebaker & Brackett PC

(57) ABSTRACT

An abnormal temperature detection system that detects an abnormal temperature in a cable used to transmit power to a electrical device. The abnormal temperature detection system includes first and second conductors that are disposed along a longitudinal axis direction of the cable, and a plurality of temperature-responsive electronic components that are disposed along the longitudinal axis direction of the cable and are electrically connected to the first and second conductors. The first and second conductors and the plurality of temperature-responsive electronic components form an electrical circuit. An abnormal temperature is detected on the basis of an electrical signal acquired from the electrical circuit.

6 Claims, 4 Drawing Sheets

(51) Int. Cl.
    *G01K 13/00*         (2006.01)
    *G01K 7/00*          (2006.01)
    *G01K 3/14*          (2006.01)
    *H05K 1/18*          (2006.01)
    *H05K 1/14*          (2006.01)
    *H05K 1/11*          (2006.01)
    *G01R 31/58*        (2020.01)

(52) U.S. Cl.
    CPC ............. *H05K 1/147* (2013.01); *H05K 1/189* (2013.01); *G01K 2003/145* (2013.01); *H05K 2201/10151* (2013.01); *H05K 2201/10545* (2013.01)

(56) References Cited

U.S. PATENT DOCUMENTS

| | | | | |
|---|---|---|---|---|
| 6,945,803 | B2* | 9/2005 | Potega | ................ G01K 1/02 |
| | | | | 439/218 |
| 8,859,909 | B2* | 10/2014 | Dimmock | .............. H05K 1/028 |
| | | | | 174/254 |
| 9,429,594 | B2* | 8/2016 | Bolcato | .............. H01R 13/5845 |
| 10,573,938 | B2* | 2/2020 | Rhein | ............... H01M 10/4257 |

FOREIGN PATENT DOCUMENTS

| | | |
|---|---|---|
| CN | 201310778 Y | 9/2009 |
| CN | 101744642 A | 6/2010 |
| JP | 355104731 A | 8/1980 |
| JP | S62137529 A | 6/1987 |
| JP | S62261076 A | 11/1987 |
| JP | S63027841 U | 2/1988 |
| JP | 363245214 A | 10/1988 |
| JP | H07296646 A | 11/1995 |
| JP | 2006337156 A | 12/2006 |

OTHER PUBLICATIONS

An Office Action mailed by China National Intellectual Property Administration dated Aug. 11, 2020, which corresponds to Chinese Patent Application No. 201910394178.1 and is related to U.S. Appl. No. 16/407,949 with English language translation.

* cited by examiner

ABNORMAL TEMPERATURE DETECTION SYSTEM, ABNORMAL TEMPERATURE DETECTION CABLE AND CABLE

This application is based on and claims the benefit of priority from Japanese Patent Application. No. 2018-094546, filed on 16 May 2018, the content of which is incorporated herein by reference.

BACKGROUND OF THE INVENTION

Field of the Invention

The present invention relates to an abnormal temperature detection system. More specifically, the present invention relates to an abnormal temperature detection system that is used to detect an abnormal temperature in a cable that is used to transmit power to an electrical device.

Related Art

Various types of industrial machines such as robots and machine tools that transport and machine items are supplied with power using cables. The power transmission cables used with these types of machines handle a large amount of current. If heat cannot be easily dissipated at a portion of the power transmission cable or the area surrounding the cable, or electrical resistance at a portion of the cable is high due to a break in the core of the cable, that portion may generate heat and become hot. When a local increase in temperature is caused by this heat generation, the temperature of the portion that is emitting heat may exceed the heat-resistant temperature of the material that covers the cable. Therefore, the cable is preferably provided with temperature detection means for detecting an abnormal temperature before such a state occurs. For example, in Patent Document 1, there is proposed a technology of using a thermocouple to measure temperature around the surface of a cable at arbitrary locations along the longitudinal direction of the cable. In Patent Document 2, there is proposed a technology of laying thermosensitive wires along a feeder. When there is a break in the thermosensitive wires or the thermosensitive wires have short-circuited, it is determined that the temperature of the feeder has risen to an abnormally high temperature and supply of power to the feeder is stopped.

Patent Document 1: Japanese Unexamined Patent Application, Publication No. S62-137529

Patent Document 2: Japanese Unexamined Patent Application, Publication No. 2006-337156

SUMMARY OF THE INVENTION

According to the technology disclosed in Patent Document 1, the temperature around the surface of the cable can be measured at arbitrary locations along the longitudinal direction of the cable. Further, according to the technology disclosed in Patent Document 2, it is possible to determine that the temperature of the feeder has risen to an abnormally high temperature when the thermosensitive wires short-circuit.

However, in the technology disclosed in Patent Document 1, a plurality of positions along the longitudinal direction of the cable must be detected for an abnormal temperature in order to determine that no portion of the cable has an abnormally high temperature. At this time, wiring corresponding to two times the number of locations to be detected needs to be provided. Therefore, it is difficult to lay out wiring to be used for temperature detection if the power transmission cable is long and abnormal temperatures need to be detected at a plurality of locations along the cable. In this case, problems occur such as the cable being too thick and it being difficult to lay out the wiring to be used for temperature detection. In the technology disclosed in Patent Document 2, abnormal temperatures are detected in response to an insulating cover that covers the thermosensitive wires melting and the thermosensitive wires short-circuiting when abnormal heat generation occurs. Therefore, the thermosensitive wires and in some cases the feeder that is in contact with the thermosensitive wires need to be replaced each time an abnormal temperature is detected.

The present invention has been made in light of the above-described problems and it is an object of the present invention to provide an abnormal temperature detection system that has a simple configuration and can confirm whether an abnormal temperature has been reached at one or more locations among a plurality of locations along the entire length of a cable.

(1) An abnormal temperature detection system according to the present invention (for example, an abnormal temperature detection system 1 to be described later) is an abnormal temperature detection system that detects an abnormal temperature in a cable (for example, a cable 4 to be described later) used to transmit power to an electrical device (for example, a robot 3 to be described later), the abnormal temperature detection system including: first and second conductors (for example, a first conductor 11 and a second conductor 12 to be described later) that are disposed along a longitudinal axis direction of the cable; and a plurality of temperature-responsive electronic components (for example, thermistors 13 to be described later) that are disposed along the longitudinal axis direction of the cable and are electrically connected in parallel to the first and second conductors, the first and second conductors and the plurality of temperature-responsive electronic components forming an electrical circuit (for example, an electrical circuit 10 to be described later), the abnormal temperature being detected on the basis of an electrical signal acquired from the electrical circuit.

(2) The abnormal temperature detection system according to (1) may further include a long flexible printed circuit board (for example, a flexible printed circuit board 20 to be described later) that is disposed along the longitudinal axis direction of the cable, in which the electrical circuit that is used to detect the abnormal temperature may be formed of the long flexible printed circuit board, and the first and second conductors and the plurality of temperature-responsive electronic components that are provided on the long flexible printed circuit board.

(3) In the abnormal temperature detection system according to (2), the long flexible printed circuit board may be made up of a plurality of FPC sub units (for example, FPC sub units 21 to be described later) provided with the first and second conductors and at least one of the temperature-responsive electronic components; the long flexible printed circuit board can be formed to a desired length through linking a desired number of FPC sub units; and the FPC sub units may include, at both ends of the FPC sub units, joining members (for example, joining pads 23 and 24 to be described later) that are used to electrically connect adjacent FCC sub units when linking the FPC sub units.

(4) In the abnormal temperature detection system according to (1) to (3), the plurality of temperature-responsive electronic components may be thermistors (for example, thermistors 13 to be described later); an electrical signal corresponding to resistance value of the thermistor that varies according to temperature may be acquired from the electrical circuit; and an abnormal temperature may be detected on the basis of results of comparison between information (for example, a current value I to be described later) based on the electrical signal and a predetermined threshold value.

(5) In the abnormal temperature detection system according to (4), the plurality of temperature-responsive electronic components may be CTR thermistors.

(6) An abnormal temperature detection cable (for example, an abnormal temperature detection cable 26 to be described later) that is built into a cable used to transmit power to an electrical device, in which the abnormal temperature detection cable may include: an electrical circuit formed of the first and second conductors and the plurality of temperature-responsive electronic components of any one of (1) to (5); and an insulating tubular member (for example, a tubular member 25 to be described later) that covers the electrical circuit.

(7) A cable (for example, a cable 4 to be described later) used to transmit power to an electrical device, in which the cable may incorporate the electrical circuit that is formed of the first and second conductors and the plurality of temperature-responsive electronic components of any one of (1) to (5).

According to the present invention, there can be provided an abnormal temperature detection system that has a simple configuration and can confirm whether an abnormal temperature has been reached at one or more locations among a plurality of locations along the entire length of a cable.

DETAILED DESCRIPTION OF THE INVENTION

First Embodiment

Figure 1:
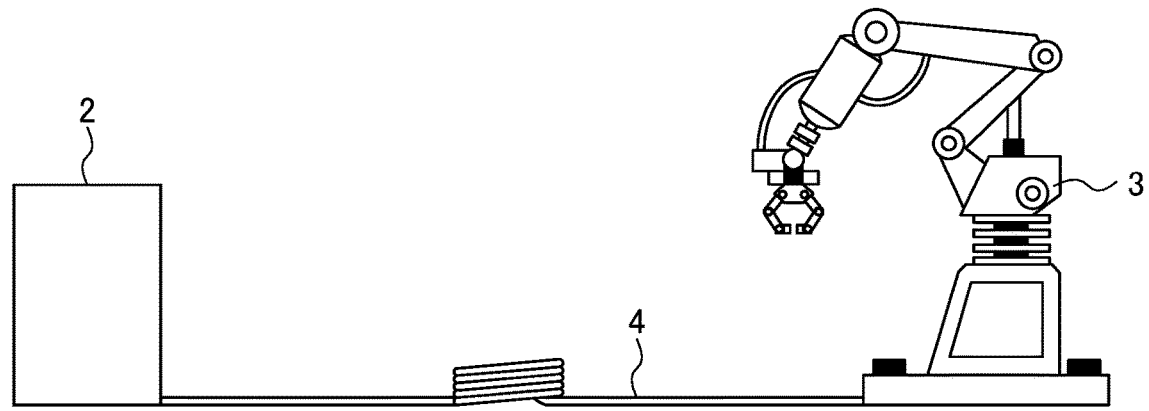
FIG. 1 is a diagram for illustrating the entire configuration of a production system with a cable that connects a robot to a power generation device according to a first embodiment of the present invention.

A first embodiment of the present invention is described in detail below with reference to the drawings. FIG. 1 is a diagram for illustrating the entire configuration of a production system that includes a cable 4 that connects a robot 3 to a power supply device 2.

The production system includes the power supply device 2, the robot 3 as an industrial machine, and the cable 4 that connects the robot 3 to the power supply device 2.

The cable 4 transmits power from the power supply device 2 to the robot 3 that functions as an electrical device. Because a large current is used to drive the robot 3, the cable 4 may generate heat depending on the state of the cable 4. For example, if a portion of the cable 4 or the area surrounding the cable 4 cannot easily dissipate heat, or electrical resistance at a portion of the cable is high due to a break in the core of the cable or a similar reason, that portion may generate heat and become hot. If the cable 4 is not laid out in a straight line (for example, is looped as shown in FIG. 1), heat is sometimes generated at the portion that is not straight.

The production robot has moving parts and required a plurality of cables. Therefore, it is difficult to lay out the cables and the above-described problems may occur in the cables.

If temperature locally increases due to heat being generated, the temperature of the portion at which the heat is generated may exceed the heat-resistant temperature of the material that encases the cable 4. Therefore, in this embodiment, the cable 4 is provided with an abnormal temperature detection system 1 for detecting an abnormal temperature.

Figure 2:
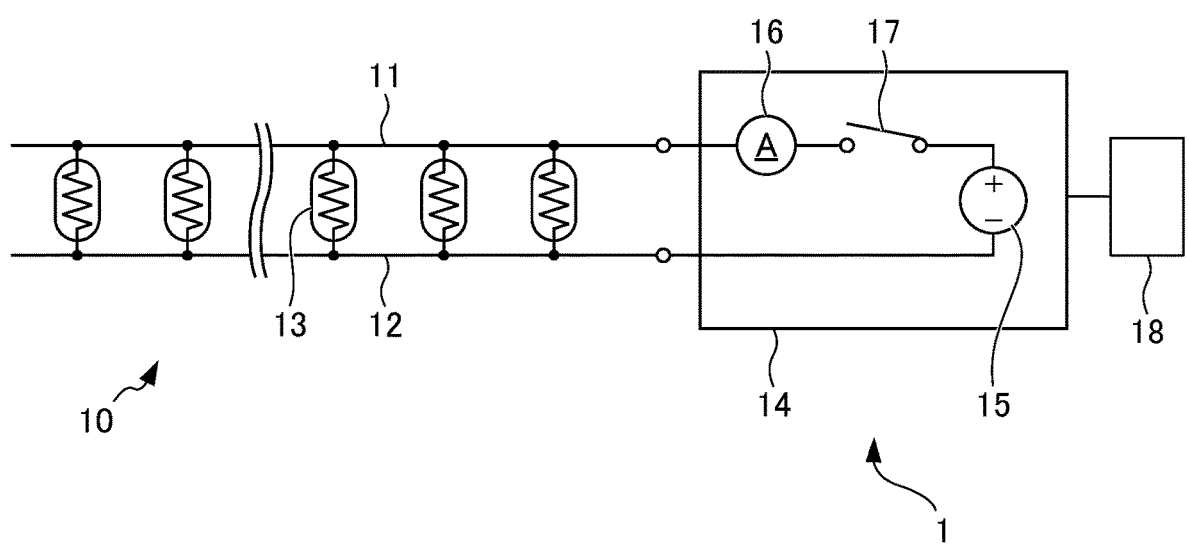
FIG. 2 is a circuit diagram for explaining the abnormal temperature detection system according to the first embodiment.

FIG. 2 is a circuit diagram for explaining the abnormal temperature detection system 1 according to the present embodiment. As illustrated in FIG. 2, the abnormal temperature detection system 1 includes a first conductor 11 and a second conductor 12 as a pair of conductors. The pair of conductors 11 and 12 are formed of, for example, lead wires and are laid along the longitudinal axis direction of the cable 4.

A plurality of thermistors 13 that function as temperature-responsive electronic components are arranged in the longitudinal axis direction of the cable 4. Contact points at each end of each thermistor 13 are electrically connected to the first conductor 11 and the second conductor 12. In other words, the plurality of thermistors 13 are connected to the pair of conductors 11 and 12 to establish a parallel connection. In this embodiment, the pair of conductors 11 and 12 and the plurality of thermistors 13 form an electrical circuit 10 that is used to detect an abnormal temperature.

As illustrated in FIG. 2, the abnormal temperature detection system 1 includes an electrical signal measuring unit 14 that measures current as an electrical signal that is acquired from the electrical circuit 10. The electrical signal measuring unit 14 includes a rated voltage source 15, an ammeter 16 and a switch 17. DC current output from the rated voltage source 15 flows in the electrical circuit 10 when the switch 17 is turned on. The ammeter 16 detects a current value of the current that flows through the electrical circuit 10. An abnormality detector 18 in the abnormal temperature detection system 1 detects an abnormal temperature on the basis of the current value detected by the electrical signal measuring unit 14. In this embodiment, the electrical signal measuring unit 14 and the abnormality detector 18 are provided in a control device (not shown). The control device and the power supply device 2 may be formed integrally.

Figure 3:
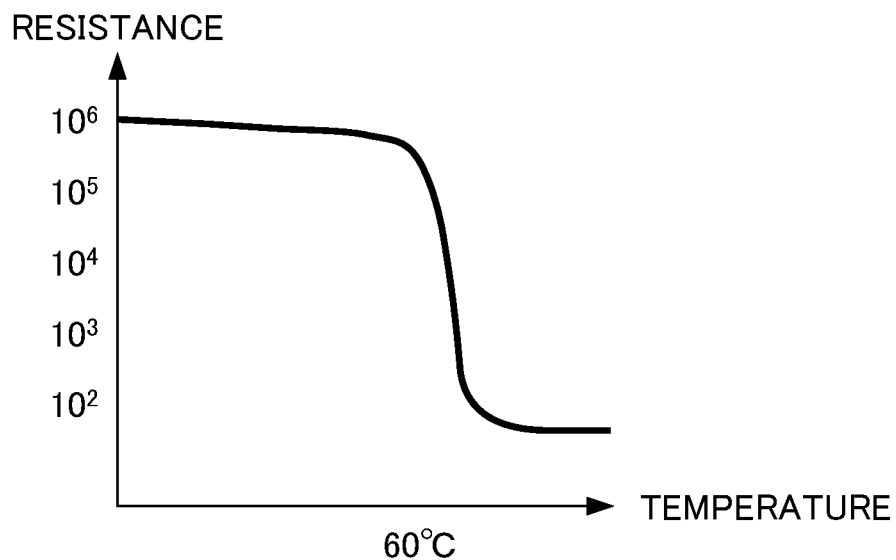
FIG. 3 is a graph for showing temperature characteristics of CTR thermistors that are provided as temperature-responsive electronic components in the abnormal temperature detection system according to the first embodiment.

FIG. 3 is a graph for showing temperature characteristics of the thermistors 13 that function as temperature-responsive electronic components. In this embodiment, the thermistors 13 are CTR thermistors.

With an NTC thermistor, which is generally used as a temperature sensor, resistance value exponentially decreases relative to temperature. This characteristic can be used to relatively easily calculate temperature from measured resistance value. However, the main aim of this embodiment is to confirm that there are no locations that have reached an abnormal temperature among a plurality of locations along the entire length of a cable, and hence temperature does not need to be checked in any detail. When using electrical signals obtained from an electrical circuit in which a plurality of thermistors are connected in parallel, temperature-responsive electronic components in which resistance value greatly varies around a predetermined temperature are preferably used in order to detect an abnormal temperature with high sensitivity. In this case, the predetermined temperature is a temperature that is to be detected as an abnormal temperature.

Therefore, CTR thermistors are used as the thermistors 13 in this embodiment. In CTR thermistors, resistance value greatly decreases when a predetermined temperature range is exceeded. For example, resistance value decreases by three or more digits when the predetermined temperature range is exceeded.

This characteristic s particularly advantageous when a plurality of thermistors are connected in parallel. That is, when a plurality of (for example, ten) thermistors are connected in parallel, resistance value of the entire electrical circuit 10 decreases by one digit under a normal state. If, for example, 100 thermistors are joined in parallel, resistance value of the entire electrical circuit 10 decreases by two digits. In other words, resistance value under a normal state decreases according to how many thermistors are connected in parallel. Therefore, with a circuit configuration in which resistance value is low under a normal state, abnormalities caused by an increase in temperature cannot be detected with high sensitivity when using electronic components that do not exhibit a large decrease in resistance value due to an increase in temperature.

With CTR thermistors, on the other hand, resistance value greatly decreases when a predetermined temperature range is exceeded. Therefore, by using CTR thermistors, abnormalities caused by an increase in temperature can be detected with very high sensitivity even when using a circuit configuration in which a plurality of thermistors are joined in parallel.

Note that the temperature at which resistance value greatly decreases in the CTR thermistor can be determined by changing the material used to form the CTR thermistor. The CTR thermistors according to this embodiment are set such that resistance value greatly reduces at a predetermined temperature in a temperature range from preferably 50° C. to 100° C., more preferably from 60° C. to 80° C. By setting the predetermined temperature within these ranges, an abnormal temperature in the cable 4 can be detected before the casing material of the cable 4 is damaged.

The electrical circuit 10, which is formed of the pair of conductors 11 and 12 and the plurality of thermistors 13, is built into the cable 4, for example.

Figure 4:
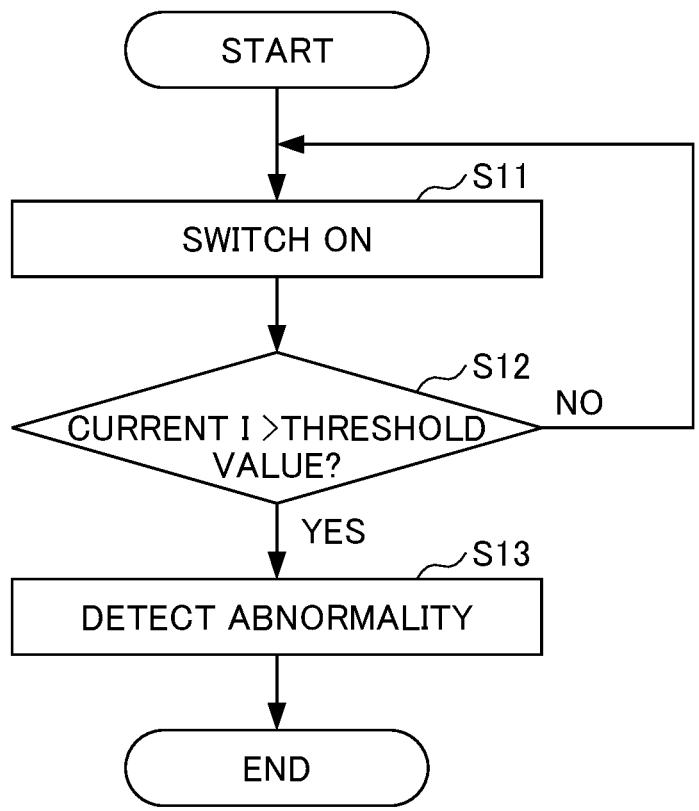
FIG. 4 is a flowchart for illustrating processing of detecting an abnormal temperature in the abnormal temperature detection system according to the first embodiment.

Processing of detecting an abnormal temperature is now described with reference to the flowchart of FIG. 4. First, in Step S11, the switch 17 is turned on to start abnormal temperature detection processing. Then, current flows from the rated voltage source 15 to the electrical circuit 10 and the ammeter 16 detects a current value I of the flowing current.

Here, under a normal state, the plurality of thermistors 13 all have high resistance value. Therefore, under a normal state, the current value I has a small value. On the other hand, if one location among a plurality of locations across the entire length of the cable has increased in temperature, the resistance value of the thermistor 13 at that location greatly decreases. At this time, because the plurality of thermistors are connected in parallel, resistance value of the entire electrical circuit 10 reduces and, in response, the current value I greatly increases. This occurs even when the temperature of only one thermistor 13 has increased.

Then, in Step S12, the current value I is compared to a predetermined threshold value. If the current value I is larger than the predetermined threshold value (Step S12: YES), it can be determined that at least one location among a plurality of locations along the entire length of the cable 4 has increased in temperature. Therefore, in Step S13, this increase in temperature is detected as an abnormal temperature. When an abnormal temperature is detected, an operator is notified of the abnormal state by using, for example, a display device in a control device (not shown). Alternatively, an alarm may be sounded or operation of the industrial machine (for example, a robot) may be stopped.

If the current value I is less than or equal to the predetermined threshold value (Step S12: NO), it is determined that there are no locations among the plurality of locations along the entire length of the cable 4 that have occurred an abnormal temperature and processing returns to Step S11. This processing is iterated at predetermined times set in advance by an operator or at times based on manual operation by the operator.

By performing the processing for detecting abnormal temperatures described above, an abnormal temperature occurring at one or more locations among a plurality of locations along the entire length of the cable can be confirmed with a simple configuration and without laying down a plurality of wires for detecting temperature. In addition, the temperature characteristics of the thermistors 13 and the threshold value used for detecting an abnormal temperature can be appropriately set to confirm an abnormal state the cable 4 at appropriate timings. Therefore, there is no need to replace the cable 4 and the electrical circuit. 10 used to detect abnormal temperatures each time an abnormal temperature is detected.

In this embodiment, CTR thermistors are used as the temperature-responsive electronic components, but NTC thermistors may be used in place of CTR thermistors. In this case, although some sensitivity when detecting temperature increases is lost, it is possible to associate resistance value and temperature with each other to some degree.

The temperature-responsive electronic components are not limited to thermistors. For example, a temperature-sensitive switch that switches on/off in response to temperature or a temperature-responsive circuit embedded with elements such as thermistors may be used. Two or more conductors may be provided to correspond to the number of contact terminals in the circuit.

In this embodiment, an abnormal temperature is detected using the current value as information based on the electrical signal acquired from the electrical circuit 10, but the information based on the electrical signal that is used to detect an abnormality is not limited to a current value. For example, a resistance value calculated on the basis of a current value may be used. Alternatively, various types of information obtained according to characteristics of the temperature-responsive electronic components can be used.

In this embodiment, the abnormal temperature detection system 1 includes the switch. 17, but the abnormal temperature detection system 1 may have a configuration where the switch 17 is not provided and the current value is monitored by constantly supplying current from a rated voltage supply. In this case, an abnormal temperature can be detected in real time.

In this embodiment, the electrical circuit 10 formed of the pair of conductors 11 and 12 and the plurality of thermistors 13 is built into the cable 4, but the electrical circuit 10 may be laid out along the outer casing of the cable 4.

The electrical circuit 10 may also be configured as an abnormal temperature detection cable that is covered by an insulating tubular member. The abnormal temperature detection cable may be built into the cable 4 or laid out along the outer casing of the cable 4.

The number of thermistors 13 provided is at least two, but more thermistors 13 are preferably provided in order to detect an abnormal temperature along the entire length of the cable 4. For example, for a short cable 4 with a length of from one to three meters, three to 20 thermistors 13, for example, five to ten thermistors 13 are preferably provided. The number of thermistors 13 is preferably changed according to the length of the cable 4. For example, for a cable 4 that is around 10 meters long, 10 to 100 thermistors 13 are preferably provided. The interval between thermistors is preferably 10 cm to one meter, more preferably 10 cm to 20 cm.

The abnormal temperature detection system according to this embodiment detects an abnormal temperature in a cable that connects a robot as an industrial device to a power supply unit. However, the cable is not limited to transmitting power to an industrial device. Similar to the cable for an industrial device according to the first embodiment, heat may be generated in a variety of different cases because a relatively large amount of current flows through the cable used to transmit power to an electrical device. Therefore, the abnormal temperature detection system according to this embodiment can be used as a system that detects an abnormal temperature in a cable that is used to transmit power to various types of electrical devices.

With the abnormal temperature detection system according to this embodiment, the following effects are achieved.

(1) The abnormal temperature detection system 1 according to this embodiment includes the first and second conductors 11 and 12 that are disposed along a longitudinal axis direction of the cable 4, and the plurality of thermistors 13 that are disposed along the longitudinal axis direction of the cable 4 and are electrically connected in parallel to the first and second conductors 11 and 12, in which the first and second conductors 11 and 12 and the plurality of thermistors 13 form an electrical circuit 10, and the abnormal temperature is detected on the basis of an electrical signal acquired from the electrical circuit 10. As a result, whether an abnormal temperature has been reached at one or more locations among a plurality of locations along the entire length of the cable can be confirmed with a simple configuration.

(2) In the abnormal temperature detection system 1 according to this embodiment, an abnormal temperature is detected on the basis of results of comparison between the current value as an electrical signal based on resistance value of the thermistor 13 that varies according to temperature, and the predetermined threshold value. By employing a circuit configuration in which the thermistors 13 are used as the temperature-responsive electronic components, whether an abnormal temperature has been reached at one or more locations among a plurality of locations along the entire length of the cable can be simply confirmed with results of comparison using a threshold value.

(3) In the abnormal temperature detection system 1 according to this embodiment, CTR thermistors are used as the plurality of temperature-responsive electronic components. By employing a circuit configuration in which CTR thermistors are used as the temperature-responsive electronic components, an abnormality caused by an increase in temperature an be detected with extremely high sensitivity, even if the thermistors are joined in parallel. Using CTR thermistors is particularly effective when employing a circuit configuration in which a plurality of thermistors are joined in parallel, and is also compatible with detecting an abnormal temperature in a long cable 4.

Second Embodiment

A second embodiment of the present invention is described below with reference to the figures. In the following description, components that are the same as those in the first embodiment are denoted by the same reference symbols and a detailed description thereof is omitted.

Figure 5A:
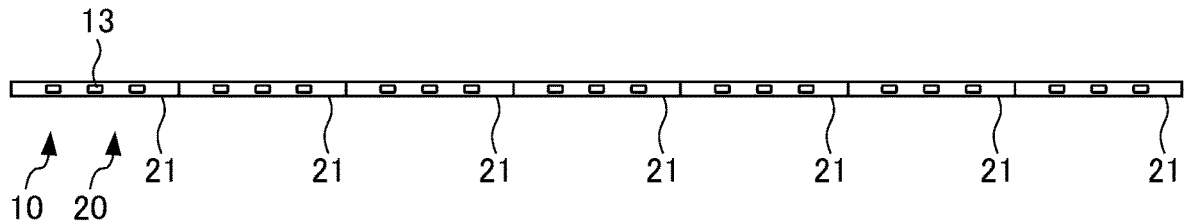
FIG. 5A is a diagram for illustrating a long flexible printed circuit board that makes up an electrical circuit used to detect an abnormal temperature in an abnormal temperature detection system according to a second embodiment of the present invention.

FIG. 5A is a diagram for illustrating a long flexible printed circuit board 20 that makes up the electrical circuit 10 used to detect an abnormal temperature. The long flexible printed circuit board 20 is formed by linking a plurality of FPC sub units 21.

Figure 5B:
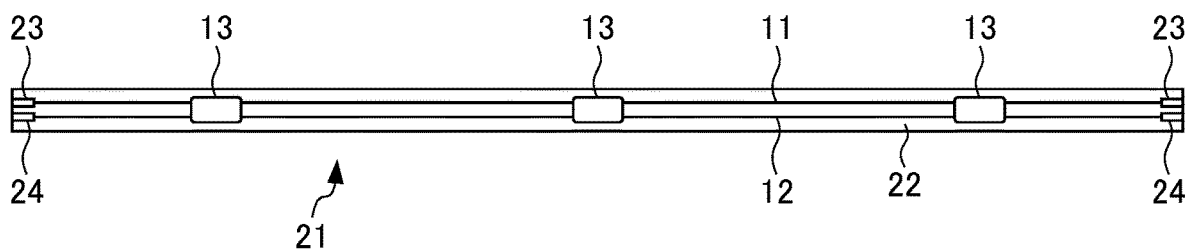
FIG. 5B is a diagram for illustrating one enlarged FPC sub unit among a plurality of FPC sub units that make up the flexible printed circuit board in the abnormal temperature detection system according to the second embodiment of the present invention.

FIG. 5B is a diagram for illustrating one enlarged FPC sub unit 21 among the plurality of FPC sub units 21 that make up the flexible printed circuit board 20. As illustrated in FIG. 5B, the FPC sub unit 21 is a sub unit of the flexible printed circuit board 20 mounted with the pair of conductors 11 and 12 and one or a plurality of thermistors 13 that function as temperature-responsive electronic components.

The FPC sub unit 21 is formed of a soft and thin base film 22 made of polyamide or a similar material, the pair of conductors 11 and 12 that are laminated on the base film 22, the thermistors 13 that function as temperature-responsive electronic components and are mounted on the base film 22 while being electrically connected to the pair of conductors 11 and 12, and a pair of joining pads 23 and 24 that function as joining members and are provided at both ends of the pair of conductors 11 and 12.

In this embodiment, the pair of conductors 11 and 12 consist of a linear conductive layer and are made of, for example, copper foil or silver paste.

CTR thermistors are preferably used as the thermistors 13 but, similar to the first embodiment, NTC thermistors may be used. Alternatively, another temperature-responsive electronic component may be used in place of thermistors. In the example illustrated in FIG. 5B, three thermistors 13 are provided in one FPC sub unit, but only one thermistor 13 may be provided in one FPC sub unit 21. Further, two thermistors 13 or four or more thermistors 13 may be provided.

The joining members are provided in the form of the joining pads 23 and 24 illustrated in FIG. 5B, but the joining members may be connection lands formed with through holes. The joining pads 23 and 24 have the same dimensional relationship at either end of the FPC sub unit 21. In this embodiment, the joining pads 23 and 24 are also formed on the rear surface (not shown) of the base film 22.

Therefore, when adjacent FPC sub units 21 are linked, the pair of joining pads 23 and 24 on the front surface of one FPC sub unit 21 and the pair of joining pads 23 and 24 on the rear surface of another FPC sub unit can be made to abut against each other so as to correspond to each other and be joined using a metal joining method such as ultrasonic welding. Through joining the FPC sub units 21 in this way, adjacent FPC sub units 21 can be linked while easily ensuring electrical connection. Various types of joining methods such as soldering, brazing, diffusion bonding, and laser welding may be employed as the metal joining method.

If connection lands formed with through holes are used as the joining members, the through holes may be filled with solder to join adjacent FPC sub units. In order to ensure mechanical strength, an adhesive or other reinforcement means may be used in addition to the above-described metal joining method to reinforce mechanical bonding strength.

In consideration of reducing the number of components, adjacent FPC sub units 21 are preferably joined to each other directly using a metal bonding method as described above. However, adjacent FPC sub units 21 may be linked using linking means that is able to ensure electrical connection between the joining members of adjacent FPC sub units 21.

The pair of conductors 11 and 12 and the thermistors 13 may be mounted on the rear surface of the base film 22 in addition to the front surface of the base film 22 to increase the number of locations at which abnormal temperature can be detected.

Next, the arrangement of cables in the power transmission cable 4 when an abnormal temperature detection cable 26 including the electrical circuit 10 formed of the flexible printed circuit board 20 is built into the power transmission cable 4 is described with reference to FIG. 6.

Figure 6A:
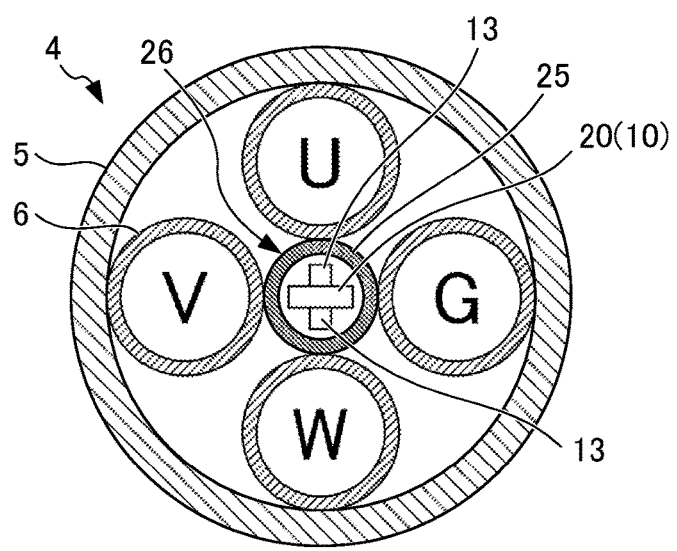
FIG. 6A is a diagram for illustrating arrangement of cables in a power transmission cable in the abnormal temperature detection system according to the second embodiment of the present invention.

FIG. 6A is a cross-sectional diagram of the power transmission cable 4. In this embodiment, the power supply device 2 is a three-phase AC power source that supplies three-phase AC power, and a three-phase four-wire system is used as the power transmission cable. Therefore, the four wires 6 indicated by the symbols U, V, W and G in FIG. 6A are disposed in a casing member 5 of the power transmission cable 4 while being covered by the insulating casing member. The wire G indicates a neutral wire.

The electrical circuit 10 formed of the flexible printed circuit board 20 is covered by an insulating tubular member 25 to form the abnormal temperature detection cable 26. The abnormal temperature detection cable 26 is built into the casing member 5 of the power transmission cable 4 and is disposed at the center of the four wires 6. In this embodiment, heat is abnormally generated in the wires in the power transmission cable 4, and hence, as illustrated in FIG. 6A, the abnormal temperature detection cable 26 is preferably disposed so as to make contact with the four wires 6. Note that, in the example illustrated in FIG. 6A, the thermistors 13 are mounted on both sides of the flexible printed circuit board 20.

Through adopting the above-described configuration, abnormal temperatures caused by heat being generated in the power transmission cable 4 can be detected with high sensitivity with a simple configuration.

Note that the tubular member 25 of the abnormal temperature detection cable 26 is preferably an insulating tube with high thermal conductivity and is preferably an EPDM tube or a silicone rubber tube. A thermal contraction tube may be used as the tubular member 25 to eliminate the layer of air between the thermistors 13 and the tubular layer 25 and improve thermal conductivity from the heat generating portion to the thermistors 13. For example, abnormal temperatures can be detected with high sensitivity when using an EPDM thermal contraction tube or a silicon rubber thermal contraction tube. In addition, the space between the thermistors 13 and the tubular member 25 may be filled with a heat-dissipating filler.

Figure 6B:
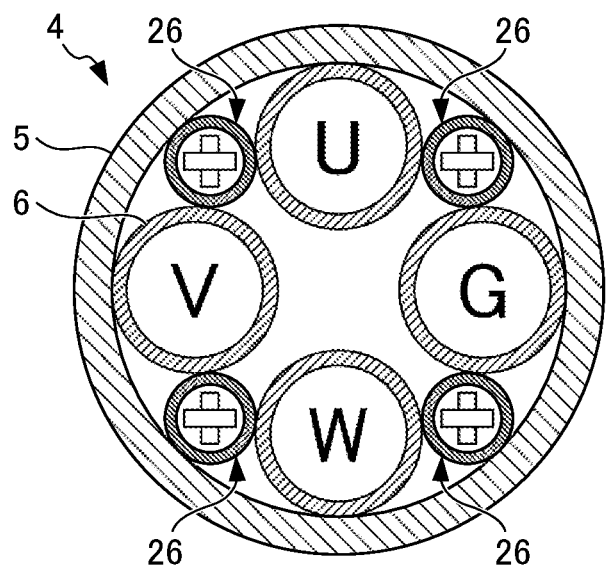
FIG. 6B is a diagram for illustrating a modification example for arranging abnormal temperature detection cables in the power transmission cable.
Figure 6C:
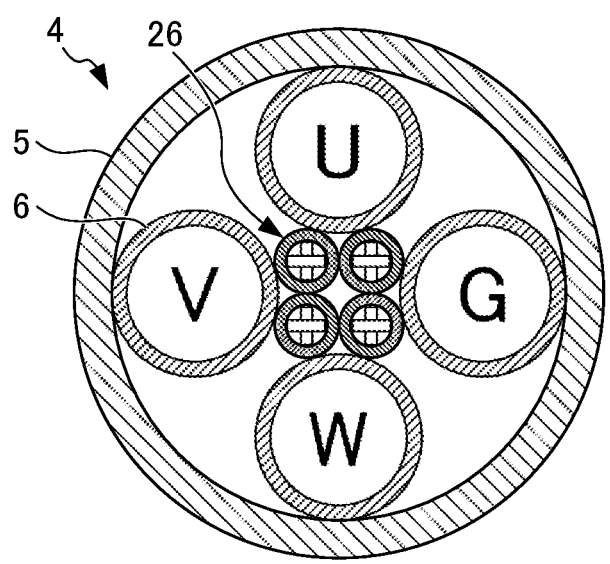
FIG. 6C is a diagram for illustrating a modification example for arranging the abnormal temperature detection cables in the power transmission cable.

FIGS. 6B and 6C are diagrams for illustrating modification examples for arranging the abnormal temperature detection cables 26 in the power transmission cable 4. In the example illustrated in FIG. 6B, the four abnormal temperature detection cables 26 are alternately disposed so as to alternate with the four wires 6. In the example illustrated in FIG. 6C, the four abnormal temperature detection cables 26 are all arranged at the center of the four wires 6. By increasing the number of abnormal temperature detection cables 26, an abnormal temperature can be detected with even higher sensitivity.

With the abnormal temperature detection system according to this embodiment, the following effects are achieved in addition to the effects (1) to (3) obtained in the first embodiment.

(4) The abnormal temperature detection system 1 according to this embodiment further includes the long flexible printed circuit board 20 that is disposed along the longitudinal axis direction of the cable 4, in which the electrical circuit 10 that is used to detect the abnormal temperature is formed of the long flexible printed circuit board 20, and the first and second conductors 11 and 12 and the plurality of thermistors 13 that are provided on the long flexible printed circuit board 20. Therefore, whether an abnormal temperature has been reached at one or more locations among a plurality of locations along the entire length of the cable can be confirmed with a simple configuration. In particular, it is easy to manufacture and wire the electrical circuit 10 used for detecting an abnormal temperature because the electrical circuit 10 is formed of the flexible printed circuit board 20.

(5) in the abnormal temperature detection system 1 according to this embodiment, the long flexible printed circuit board 20 can be formed to a desired length through linking a desired number of the FPC sub units 21; and the FPC sub units 21 include, at either end of the FPC sub units 21, joining members 23 and 24 that are used to electrically connect adjacent FPC sub units 21 when linking the FPC sub units 21. Therefore, the electrical circuit 10 used for detecting an abnormal temperature can be formed to a desired length by linking an appropriate number of the FPC sub units 21 according to the length of the cable 4 that is to be used for abnormal temperature detection. In other words, the FPC sub units 21 can be linked together as one unit to correspond to cables 4 of various lengths. In addition, parts management is made easy because the FPC sub units 21 are formed as one unit. Manufacturing is also easy because the length of one FPC sub unit 21 is short.

(6) The abnormal temperature detection cable 26 according to this embodiment includes the electrical circuit 10 and the insulating tubular member that covers the electrical circuit 10. Therefore, it is easy to install the abnormal temperature detection cable 26 that is to be used for abnormal temperature detection.

(7) The power transmission cable 4 according to this embodiment incorporate the electrical circuit 10. Therefore, an abnormal temperature caused by heat being emitted in the power transmission cable 4 can be detected with high sensitivity.

Note that the present invention is not limited to the above-described embodiments and includes any changes or modifications made within the scope of the present invention.

EXPLANATION OF REFERENCE NUMERALS

1 abnormal temperature detection system
2 power supply device
3 robot (electrical device)
4 cable
10 electrical circuit
11 first conductor
12 second conductor
13 thermistor (temperature-responsive electronic component)
14 electrical signal measuring unit
18 abnormality detector
20 flexible printed circuit board
21 FPC sub unit
23, 24 joining pad
25 tubular member
26 abnormal temperature detection cable

What is claimed is:

1. An abnormal temperature detection system that detects an abnormal temperature in a cable used to transmit power to an electrical device, the abnormal temperature detection system comprising:
   first and second conductors that are disposed along a longitudinal axis direction of the cable;
   a plurality of temperature-responsive electronic components that are disposed along the longitudinal axis direction of the cable and are electrically connected to the first and second conductors to establish a parallel connection; and
   a long flexible printed circuit board that is disposed along the longitudinal axis direction of the cable,
   wherein the long flexible printed circuit board, the first and second conductors and the plurality of temperature-responsive electronic components form an electrical circuit, the abnormal temperature being detected on the basis of an electrical signal acquired from the electrical circuit.

2. The abnormal temperature detection system according to claim 1, wherein:
   the long flexible printed circuit board is made up of a plurality of flexible printed circuit (FPC) sub units;
   the long flexible printed circuit board can be formed to a desired length through linking a desired number of FPC sub units; and
   the FPC sub units include, at both ends of the FPC sub units, joining members that are used to electrically connect adjacent FPC sub units when linking the FPC sub units.

3. The abnormal temperature detection system according to claim 1, wherein:
   the plurality of temperature-responsive electronic components are thermistors;
   an electrical signal corresponding to a resistance value of the thermistors that varies according to temperature is acquired from the electrical circuit; and
   an abnormal temperature is detected on the basis of results of comparison between information based on the electrical signal and a predetermined threshold value.

4. The abnormal temperature detection system according to claim 3, wherein the plurality of temperature-responsive electronic components are critical-temperature resistor (CTR) thermistors.

5. An abnormal temperature detection cable that is built into a cable used to transmit power to an electrical device, the abnormal temperature detection cable including:
   an electrical circuit formed of the first and second conductors, the plurality of temperature-responsive electronic components and the long flexible printed circuit board of claim 1; and
   an insulating tubular member that covers the electrical circuit.

6. A cable used to transmit power to an electrical device, the cable incorporating the electrical circuit that is formed of the first and second conductors, the plurality of temperature-responsive electronic components and the long flexible printed circuit board of claim 1.

* * * * *